(12) United States Patent
Kitano et al.

(10) Patent No.: US 6,518,199 B2
(45) Date of Patent: Feb. 11, 2003

(54) METHOD AND SYSTEM FOR COATING AND DEVELOPING

(75) Inventors: Junichi Kitano, Nirasaki (JP); Yuji Matsuyama, Kikuchi (JP); Takahiro Kitano, Kikuchi (JP); Hidetami Yaegashi, Minato (JP)

(73) Assignee: Tokyo Electron Limited, Tokyo (JP)

( * ) Notice: Subject to any disclaimer, the term of this patent is extended or adjusted under 35 U.S.C. 154(b) by 13 days.

(21) Appl. No.: 09/851,134

(22) Filed: May 9, 2001

(65) Prior Publication Data

US 2002/0006737 A1 Jan. 17, 2002

(30) Foreign Application Priority Data

May 10, 2000 (JP) .......................... 2000-137498

(51) Int. Cl.[7] ............... H01L 21/31; G03C 5/00
(52) U.S. Cl. .............. 438/758; 438/780; 430/325; 430/327
(58) Field of Search ................ 438/758, 767, 438/780, 789, 790, 793, 794; 430/327, 313, 314, 322, 325, 330

(56) References Cited

U.S. PATENT DOCUMENTS

| | | | | |
|---|---|---|---|---|
| 4,985,722 A | * | 1/1991 | Ushijima et al. | 134/66 |
| 5,339,128 A | * | 8/1994 | Tateyama et al. | 396/564 |
| 6,022,672 A | * | 2/2000 | Ikeda | 430/325 |
| 6,451,515 B2 | * | 9/2002 | Takamori et al. | 430/327 |

* cited by examiner

Primary Examiner—Wael Fahmy
Assistant Examiner—Brook Kebede
(74) Attorney, Agent, or Firm—Oblon, Spivak, McClelland, Maier & Neustadt, P.C.

(57) ABSTRACT

The present invention relates to a method for performing coating and developing treatment for a substrate, which comprises the steps of: supplying a coating solution to the substrate to form a coating film on the substrate; performing heat treatment for the substrate on which the coating film is formed; cooling the substrate after the heat treatment; performing exposure processing for the coating film formed on the substrate; and developing the substrate after the exposure processing, and further comprises the step of supplying a treatment gas to form a treatment film on a surface of the coating film after the step of forming the coating film and before the step of performing the exposure processing for the substrate. According to the present invention, the treatment gas is supplied to form the treatment film on the surface of the coating film after the step of forming: the coating film and before the step of exposing the substrate, whereby the substrate can be protected from impurities such as oxygen and water vapor in an atmosphere by this treatment film.

8 Claims, 13 Drawing Sheets

METHOD AND SYSTEM FOR COATING AND DEVELOPING

BACKGROUND OF THE INVENTION

1. Field of the Invention

The present invention relates to coating and developing treatment method and system for a substrate.

2. Description of the Related Art

In photolithography of the process of fabricating a semiconductor device, for example, resist coating treatment for forming a resist film on the surface of a wafer, developing treatment for developing the wafer after pattern exposure, heat treatment and cooling treatment performed before the coating treatment, before and after exposure processing, and after the developing treatment, and the like are performed. Such treatment and processing are performed in treatment units provided individually, and these treatment units are unified as a coating and developing treatment system so as to continuously perform the aforesaid successive treatment and processing. The exposure treatment of a pattern is usually performed in an aligner disposed adjacent to the coating and developing treatment system.

When the wafer is treated in this coating and developing treatment system, air cleaned by an air cleaner or the like, for example, is supplied as down-flowing air into the coating and developing treatment system in order to prevent impurities from adhering to the wafer, while an atmosphere in the coating and developing treatment system is exhausted, whereby the wafer can be treated in a clean condition.

In recent years, however, exposure technology in which a beam with a shorter wavelength (for example, 157 nm) is used is being developed to form a finer and more precise circuit pattern. When the beam with the short wavelength is used, there is a fear that even impurities at molecular level such as oxygen, ozone, and water vapor which have been insignificant so far exert a bad influence on exposure processing, whereby a precise circuit pattern is not formed.

Hence, when at least the wafer is subjected to exposure processing, it is required that no impurities such as oxygen adhere onto the wafer. If only clean air is supplied as in prior arts, the adhesion of impurities onto the wafer can not be suppressed effectively since impurities such as oxygen are contained in the air, and moreover impurities adhering onto the wafer can not be removed.

SUMMARY OF THE INVENTION

The present invention is made in view of such a point, and its object is to provide a coating and developing treatment method and a coating and developing treatment system for preventing fine impurities at molecular level from adhering to a substrate such as a wafer.

To attain this object, a coating and developing treatment method of the present invention is a method for performing coating and developing treatment for a substrate, comprising the steps of: supplying a coating solution to the substrate to form a coating film on the substrate; performing heat treatment for the substrate on which the coating film is formed; cooling the substrate after the heat treatment; performing exposure processing for the coating film formed on the substrate; and developing the substrate after the exposure processing, the method further comprising the step of supplying a treatment gas to form a treatment film on a surface of the coating film after the step of forming the coating film and before the step of performing the exposure processing for the substrate.

The step of supplying the treatment gas to form the treatment film on the surface of the coating film may be performed after the step of cooling the substrate after the heat treatment, may be performed during the step of cooling the substrate after the heat treatment, may be performed after the step of performing the heat treatment, or may be performed during the step of performing the heat treatment.

Furthermore, a coating and developing treatment system of the present invention is a coating and developing treatment system for performing coating and developing treatment for a substrate, comprising: a coating treatment unit for forming a coating film on the substrate; a developing treatment unit for developing the substrate; a thermal treatment unit for performing thermal treatment for the substrate; and a treatment gas supply unit for supplying a treatment gas to the coating film formed on the substrate to form a treatment film on a surface of the coating film.

It should be mentioned that the thermal treatment unit in the present invention implies a heat treatment unit, a cooling treatment unit, and a heat and cooling treatment unit.

According to the present invention, the treatment gas is supplied to form the treatment film on the surface of the coating film after the step of forming the coating film and before the step of exposing the substrate, whereby the substrate can be protected from impurities such as oxygen and water vapor in an atmosphere by this treatment film. Especially, if the impurities adhere to the substrate when the substrate is subjected to exposure processing, there is a possibility that the impurities absorb energy of a laser beam or the like used in exposure so that the exposure processing is not suitably performed. The aforesaid formation of the treatment film, however, enables suitable exposure processing. Further, the treatment film formed by the treatment gas is excellent in permeability, and permits a beam with a wavelength as short as about 157 nm to pass it. Accordingly, the adhesion of impurities to the coating film formed on the substrate is prevented while a predetermined circuit pattern can be precisely exposed onto this coating film.

DETAILED DESCRIPTION OF THE PREFERRED EMBODIMENT

Figure 1:
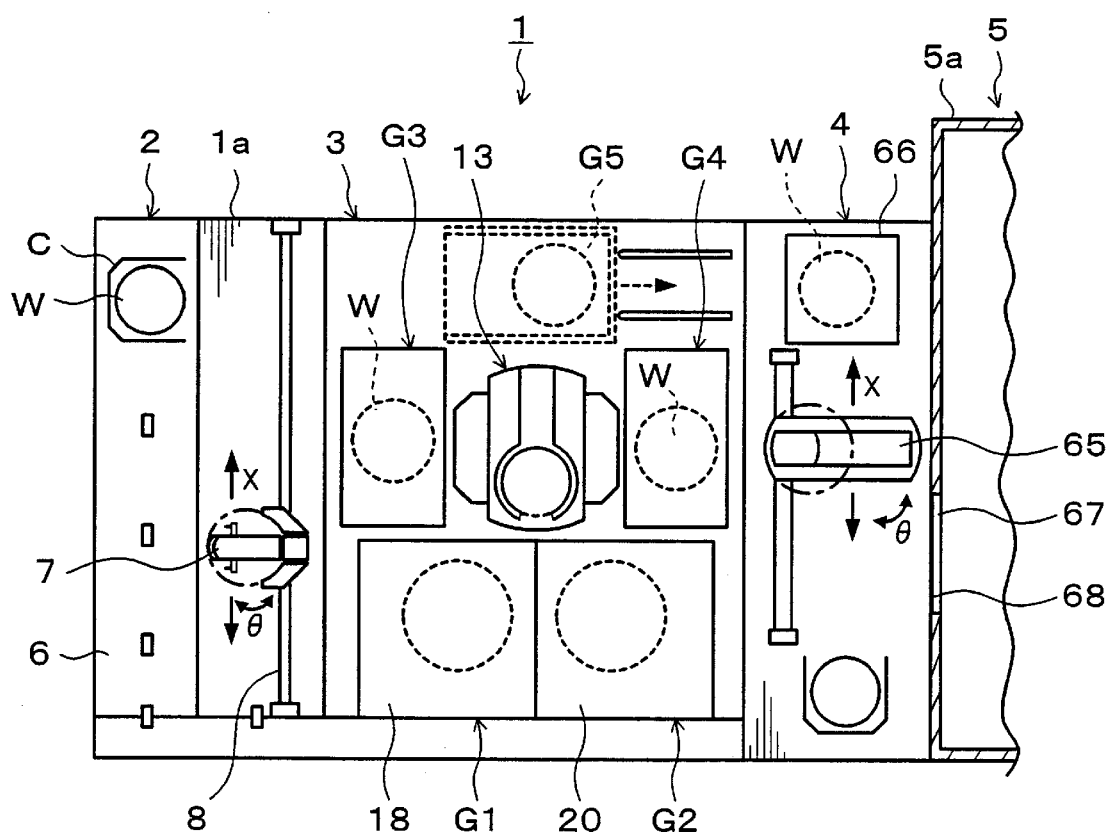
FIG. 1 is an explanatory plan view of a coating and developing treatment system according to the present embodiment.
Figure 2:
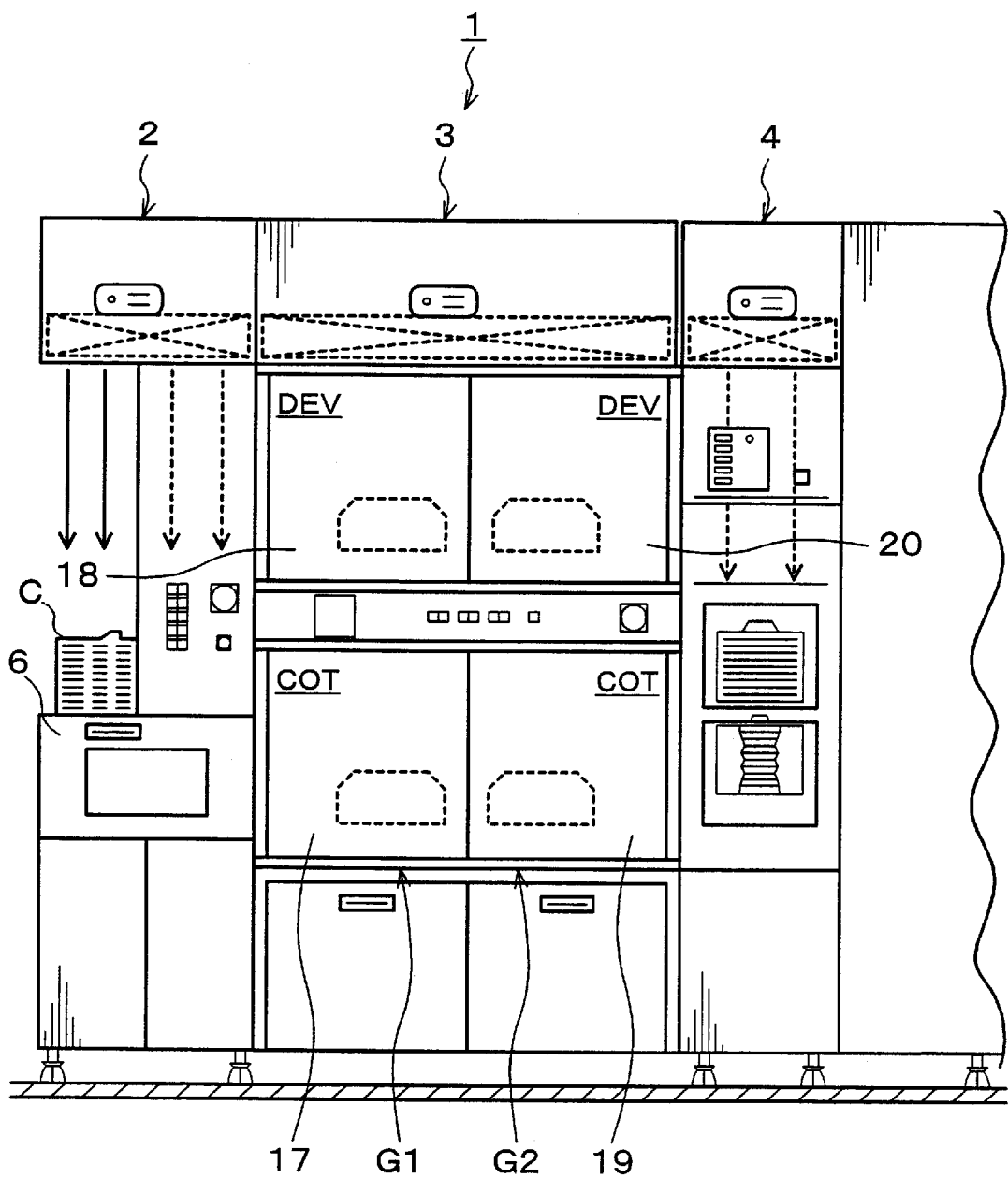
FIG. 2 is a front view of the coating and developing treatment system in FIG. 1.
Figure 3:
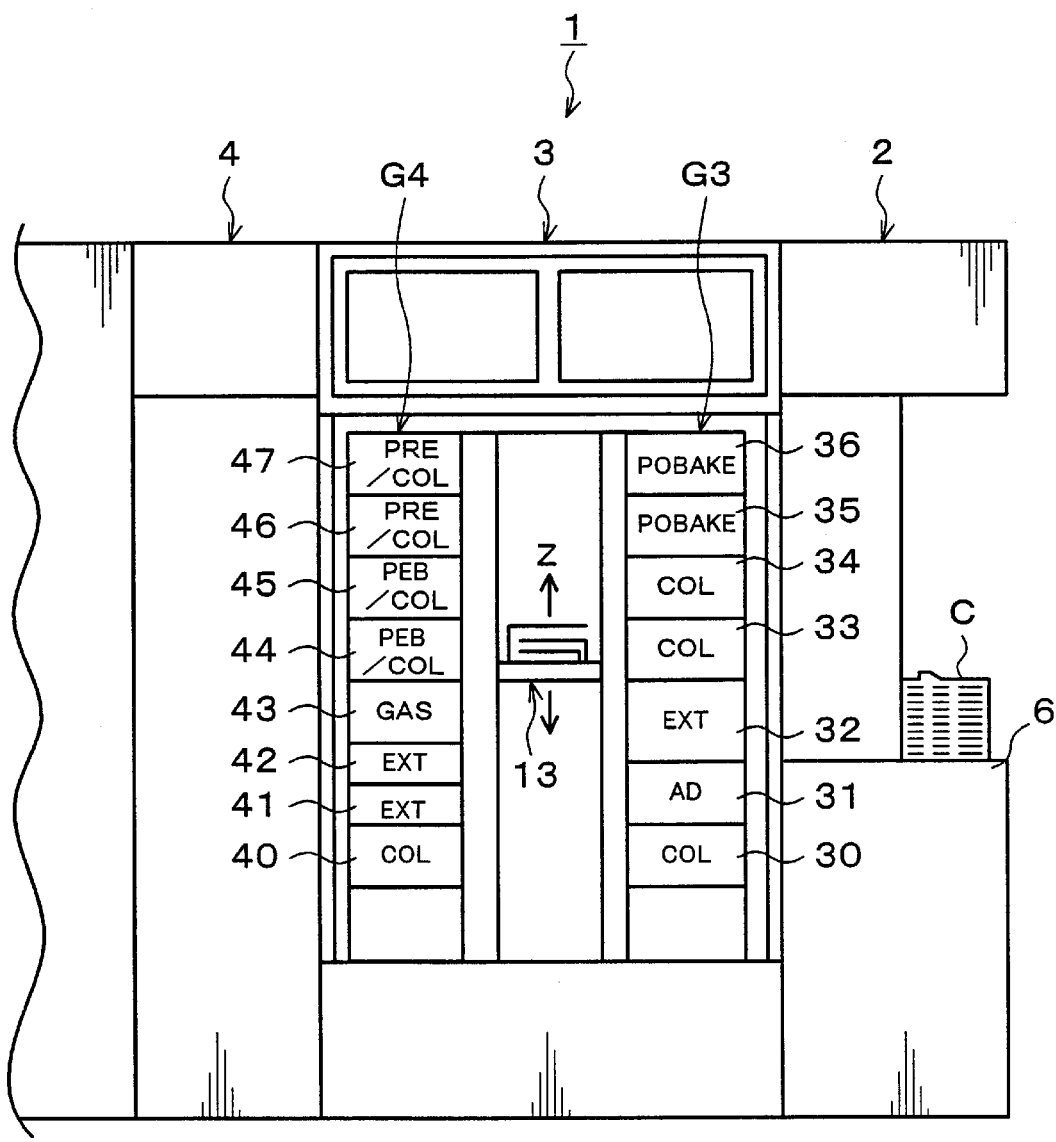
FIG. 3 is a rear view of the coating and developing treatment system in FIG. 1;.

A preferred embodiment of the present invention will be explained below. FIG. 1 is a plan view of a coating and developing treatment system 1 according to this embodiment, FIG. 2 is a front view of the coating and developing treatment system 1, and FIG. 3 is a rear view of the coating and developing treatment system 1.

As shown in FIG. 1, the coating and developing treatment system 1 has a structure in which, a cassette station 2 for transferring, for example, 25 wafers W per cassette, as a unit, from/to the outside into/from the coating and developing treatment system 1 and carrying the wafer W into/out of a cassette C, a processing station 3 as a treatment section where various kinds of treatment units each of which performs predetermined treatment for the wafers W one by one in a coating and developing process are stacked in multiple tiers, and an interface section 4 for receiving and sending the wafer W from/to an aligner 5 provided adjacent to the coating and developing treatment system I are integrally connected in a casing 1a.

In the cassette station 2, a plurality of cassettes C are freely mounted in a line in an X-direction (in a top-to-bottom direction in FIG. 1) at predetermined positions on a cassette mounting table 6 which is a mount portion. A wafer carrier 7 movable in the direction of arrangement of the cassettes (the X-direction) and in the direction of arrangement of the wafers W housed in the cassette C (a Z-direction, i.e., vertical direction) can freely move along a carrier path 8 and selectively get access to each of the cassettes C.

The wafer carrier 7 has an alignment function of aligning the wafer W. This wafer carrier 7 is structured to be able to get access to an extension unit 32 and an adhesion unit 31 included in a third treatment unit group G3 on the processing station 3 side as will be described later.

In the processing station 3, a main carrier unit 13 is disposed in the middle thereof, and around the main carrier unit 13, various treatment units are stacked in multiple tiers to compose treatment unit groups. In this coating and developing treatment system 1, four treatment unit groups G1, G2, G3, and G4 are disposed. The first and second treatment unit groups G1 and G2 are disposed on the front side of the coating and developing treatment system 1. The third treatment unit group G3 is disposed adjacent to the cassette station 2. The fourth treatment unit group G4 is disposed adjacent to the interface section 4. Moreover, a fifth treatment unit group G5 shown by a broken line can be additionally disposed on the rear side as an option. The main carrier unit 13 can carry the wafer W into/out of various treatment units which are disposed in these treatment unit groups G1, G2, G3, G4, and G5 and will be described later.

In the first treatment unit group G1, for example, as shown in FIG. 2, a resist coating unit 17 for coating the wafer with a resist solution and a developing treatment unit 18 for subjecting the wafer W after exposure processing to developing treatment are stacked in two tiers from the bottom in order. Similarly, in the second treatment unit group G2, a resist coating unit 19 and a developing treatment unit 20 are stacked in two tiers from the bottom in order.

In the third treatment unit group G3, a cooling unit 30 for subjecting the wafer W to cooling treatment, an adhesion unit 31 for enhancing adhesion of the resist solution and the wafer W, an extension unit 32 for making the wafer W wait, cooling units 33 and 34 for cooling the wafer W after developing treatment, postbaking units 35 and 36 for subjecting the wafer W after developing treatment to heat treatment, or the like are stacked, for example, in seven tiers from the bottom in order.

In the fourth treatment unit group G4, a cooling unit 40 for subjecting the wafer W to cooling treatment, extension units 41 and 42, a gas supply unit 43 (GAS in FIG. 3) having a gas nozzle 55 as a treatment gas supply means in the present invention, heat and cooling treatment units 44 and 45 (PEB/COL in FIG. 3) for heating (post-exposure baking) the wafer W after exposure processing and thereafter cooling the wafer W to a predetermined temperature, heat and cooling treatment units 46 and 47 (PRE/COL in FIG. 3) as thermal treatment units before exposure for heating the wafer W before exposure processing to vaporize a solvent in a resist solution and thereafter cooing the wafer W to a predetermined temperature, or the like are stacked, for example, in eight tiers from the bottom in order.

Figure 4:
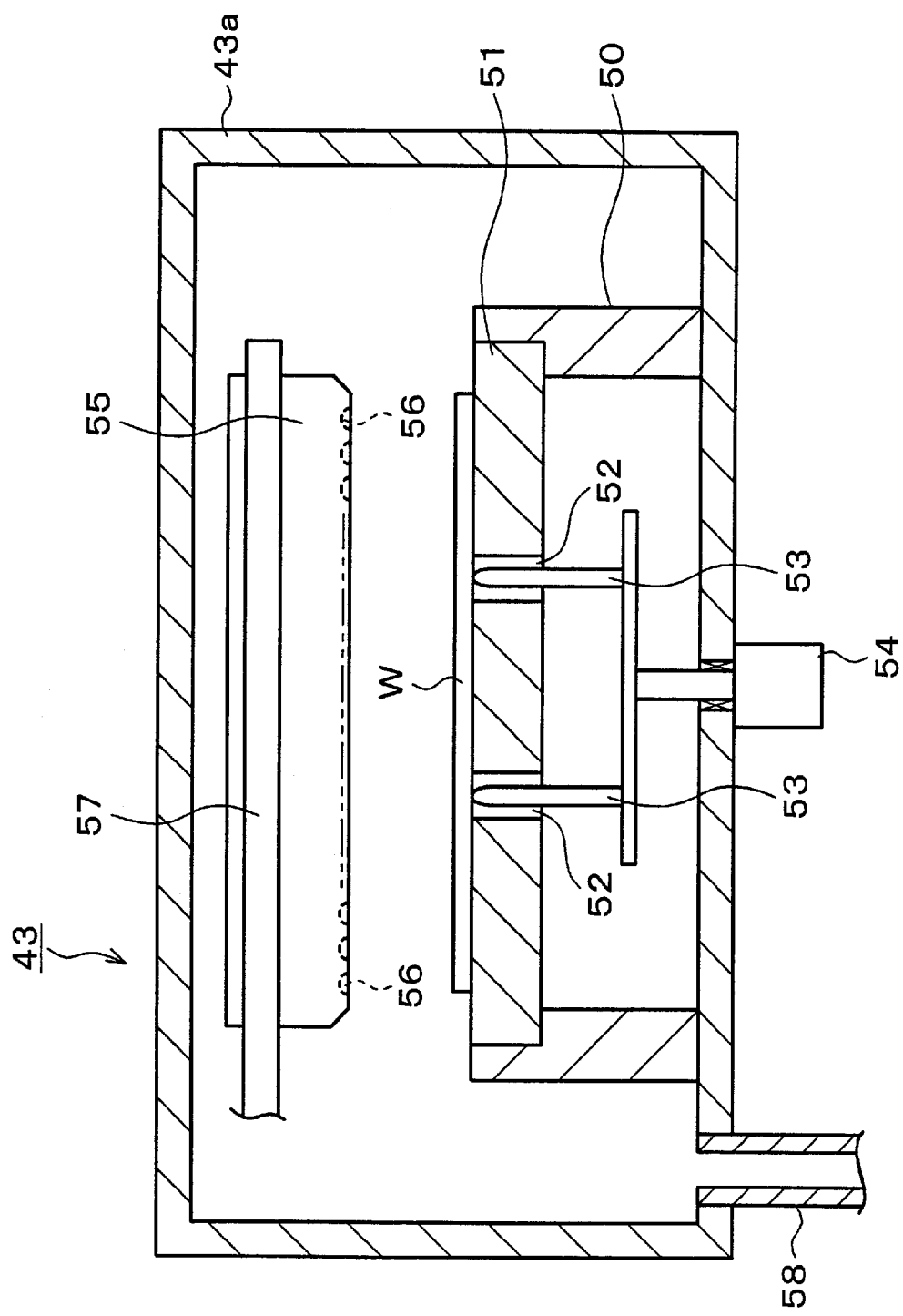
FIG. 4 is an explanatory view of a vertical section of a gas supply unit in the coating and developing treatment system in FIG. 1.

As shown in FIG. 4, a case 50 is provided in a casing 43a in the gas supply unit 43. A disc-shaped mounting board 51 is attached to this case 50. Three through-holes 52 are formed in the mounting board 51, and raising and lowering pins 53 are respectively provided in the through-holes 52 and structured to be freely raised and lowered in the through-holes 52 by a raising and lowering mechanism 54, to raise and lower the wafer W to thereby mount the wafer W on the mounting board 51, and to be able to receive and send the wafer W from/to the main carrier unit 13 and a wafer carrier 65 which will be described later.

Figure 5:
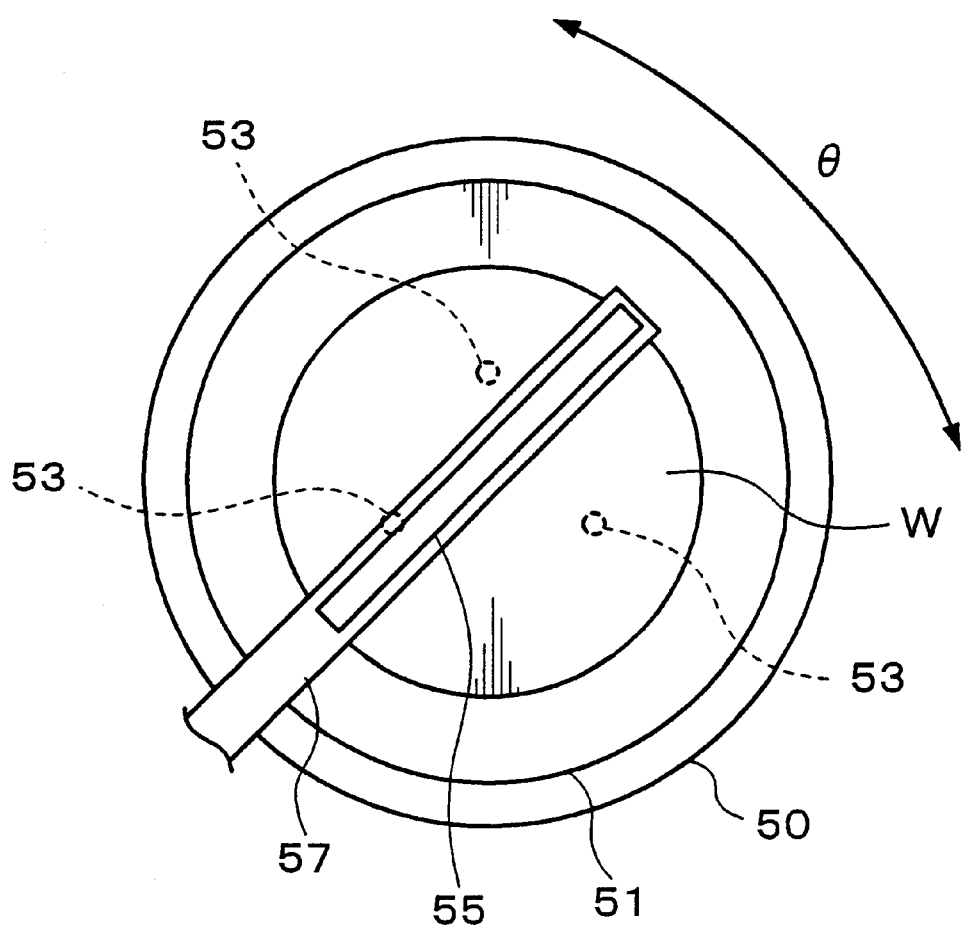
FIG. 5 is a plan view showing a state in which a protective gas is supplied to a wafer.

A gas nozzle 55 for supplying a protective gas as a treatment gas is provided above the mounting board 51. The lateral width of this gas nozzle 55 is almost the same as the diameter of the wafer W for example, and supplies the protective gas from a plurality of discharge ports 56 formed in its lower face. The gas nozzle 55 is supported by an arm 57, and; as shown in FIG. 5, the arm 57 is rotated in a θ-direction above the wafer W by a drive mechanism (not illustrated). Thus, the gas nozzle 55 supplies the protective gas to all the entire wafer W. An exhaust pipe 58 for exhausting an atmosphere in the casing 43a is connected to the bottom of the casing 43a.

A fluorine ($F_2$) series gas, for example, is used as the protective gas. As examples of the fluorine series protective gas, a gas containing a copolymer of norbornane and tetrafluoroethylene and a gas containing a polymer substituted for hexafluoronol on norbornane are given. Also a gas containing macromolecules such as polysiloxane or a series in which an alicyclic group is attached on polyacrylic acid can be proposed.

Figure 6:
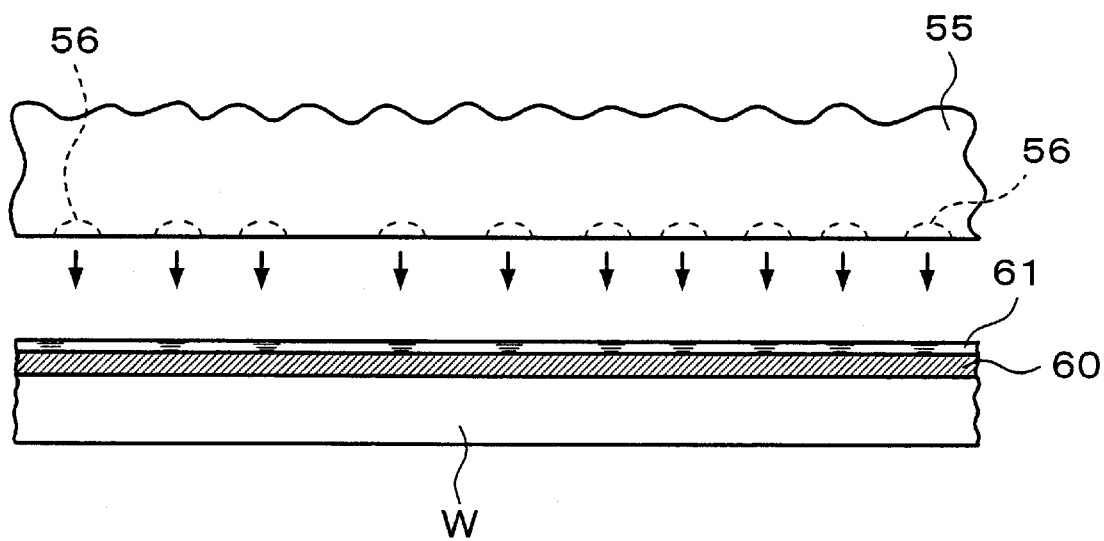
FIG. 6 is an explanatory view of an enlarged vertical section showing the state in which the protective gas is supplied to the wafer.

When the protective gas is supplied, as shown in FIG. 6, a protective film 61 with a thin film thickness is formed on the surface of a resist film 60 formed on the wafer W, and the resist film 60 is covered with the protective film 61. The protective film 61 keeps impurities at a distance and protects the resist film 60 from oxygen, ozone, water vapor, and the like in the atmosphere. Moreover, the protective film 61 has high permeability and thereby allows even a beam with a short wavelength to pass through it, whereby a predetermined circuit pattern can be exposed on the resist film 60.

Figure 7:
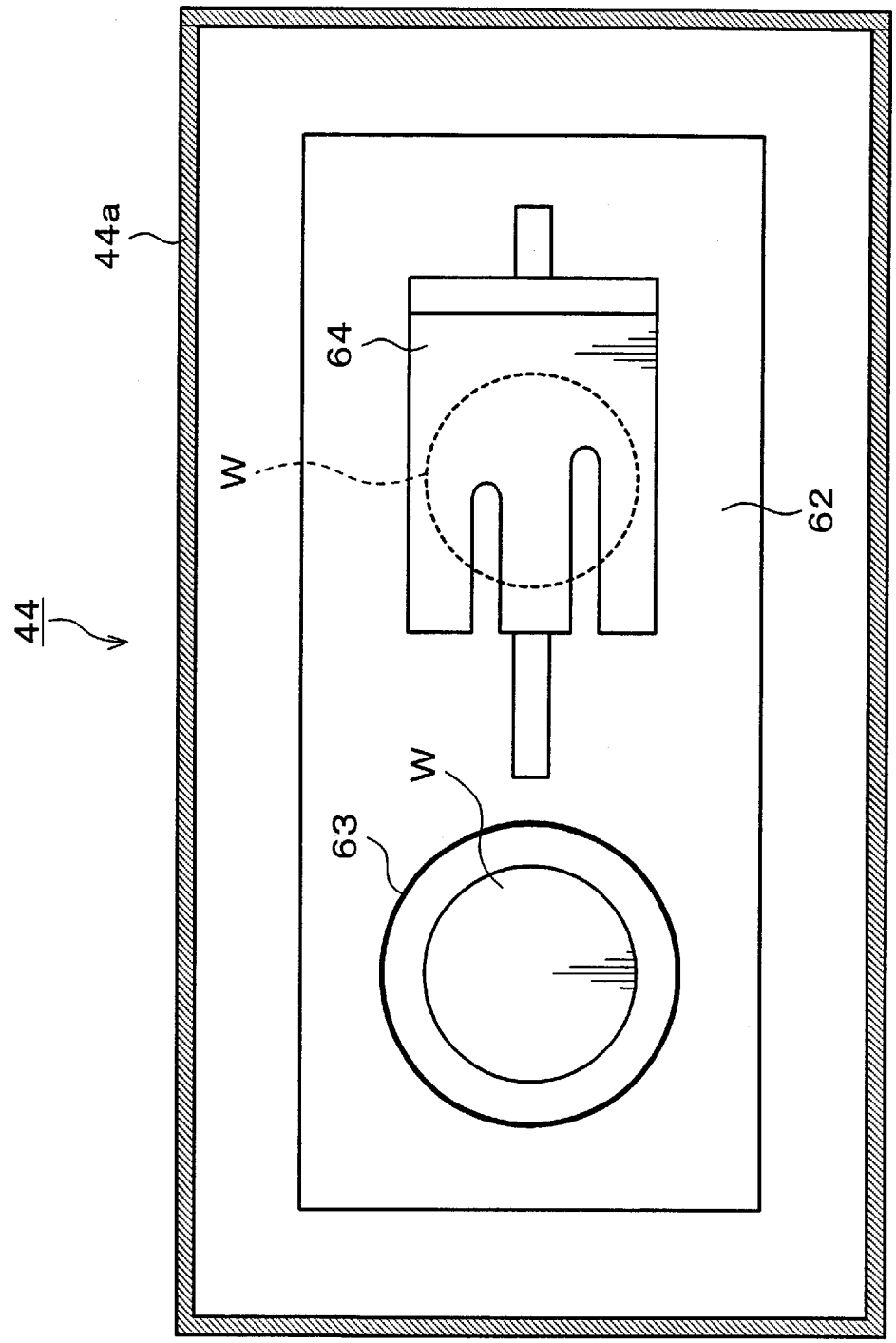
FIG. 7 is a schematic horizontal sectional view showing a heat and cooling treatment unit in the coating and developing treatment system in FIG. 1.

As shown in FIG. 7, the heat and cooling treatment unit 44 has a disc-shaped hot plate 63 for heating the wafer W and a chill plate 64 which moves onto the hot plate 63 to receive the wafer W from the hot plate 63 and cools the wafer W, on a base 62 in a casing 44a. The heat and cooling treatment unit 44 performs heat and cooling treatment for the wafer W continuously in the same unit, whereby a thermal budget given to the wafer W by heating can be kept always constant. The other heat and cooling units 45 to 47 have the same structure.

A wafer carrier 65 is provided in the middle of the interface section 4. The wafer carrier 65 is structured to be freely movable in the X-direction (the top-to-bottom direction in FIG. 1) and the Z-direction (the vertical direction) and rotatable in the θ -direction (the direction of rotation around a Z-axis) so as to be able to get access to the extension units 41 and 42 and the gas supply unit 43 which are included in the fourth treatment unit group G4, a peripheral exposure unit 66, and the aligner 5 to transfer the wafer W to each of them.

The aligner 5 for subjecting the wafer W to exposure processing is provided adjacent to the interface section 4. This aligner 5 is hermetically sealed by a casing 5a of the aligner 5, so that an atmosphere in the aligner 5 can be tightly controlled. A transit opening 67 through which the wafer W is carried into/out of the interface section 4 is provided on the interface section 4 side of the casing 5a, and a shutter 68 for freely opening and closing the transit opening 67 is provided at the transit opening 67.

Next, a photolithography process performed in the coating and developing treatment system 1 structured as above will be explained.

When the treatment of the wafer W is started, first in the cassette station 2, one untreated wafer W is taken out of the cassette C by the wafer carrier 7 and carried into the adhesion unit 31 in the third processing station 3.

The wafer W which is coated with an adhesion promoter such as HMDS which promotes adhesion with the resist solution in the adhesion unit 31 is then transferred to the cooling unit 30 by the main carrier unit 13 and cooled to a predetermined temperature.

Figure 8:
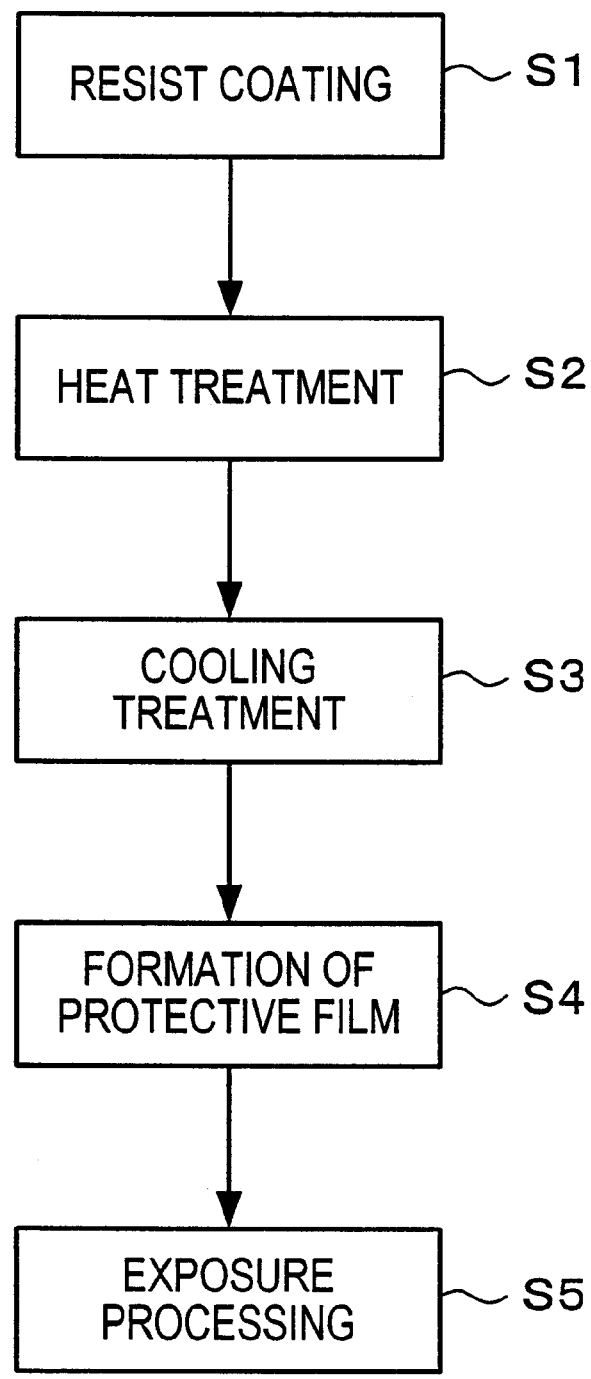
FIG. 8 is a flowchart showing a treatment flow from resist coating to exposure processing.

Thereafter, the wafer W is treated based on the flow shown in FIG. 8 until it is subjected to exposure processing Namely, as shown in FIG. 8, the wafer W is transferred to the resist coating unit 17 or 18 and subjected to resist coating treatment (S1 in FIG. 8). The wafer W on which a resist film is formed is transferred to the heat and cooling treatment unit 46 or 47 (PRE/COL in FIG. 3). In the heat and cooling treatment unit 46 or 47, the wafer W is subjected to heat treatment by the hot plate 63 (S2 in FIG. 8) and cooling treatment (S3 in FIG. 8) by the chill plate 64.

On this occasion, instead of performing heat treatment and cooling treatment sequentially in respective units provided separately, heat and cooling treatment is performed in a single unit such as the heat and cooling treatment unit 46 or 47, whereby the time required from the heat treatment to the cooling treatment of the wafer W can be kept always constant, and consequently a thermal budget given to the wafer W by heating can be made the same among the wafers W. Moreover, in this embodiment, all the heat and cooling treatment between the resist coating treatment and the developing treatment are performed by means of the heat and cooling treatment units 44 to 47, whereby the time required from the resist coating treatment to the developing treatment can be made the same for all the wafers W.

Thereafter, the wafer W is transferred to the gas supply unit 43. As shown in FIG. 6, the protective gas is supplied to the wafer W to thereby form the protective film 61 on the surface of the resist film 60 (S4 in FIG. 8).

The wafer W is then transferred to the extension unit 41, and the wafer carrier 65 receives the wafer W from the extension unit 41 and transfers the wafer W to the peripheral exposure unit 66 in the interface section 4. The wafer W the peripheral portion of which is exposed is transferred to the aligner 5 through the transit opening 67. At this time, the shutter 68 is opened. After the wafer W is transferred to the aligner 5, the shutter 68 is closed again.

While the wafer W is transferred from the gas supply unit 43 to the aligner 5, the protective film 61 protects not only the surface of the resist film 60 but also the wafer W itself and prevents impurities such as oxygen, ozone, and water vapor, and particulates from adhering thereto. Hence, the wafer W can be transferred to the aligner 5 in a clean condition. In the aligner 5, a predetermined circuit pattern is exposed on the wafer W (S5 in FIG. 8).

The wafer W which has undergone exposure is transferred to the extension unit 42 in the processing station 3 through the interface section 4 by the wafer carrier 65 again. The wafer W is then transferred to the heat and cooling treatment unit 44 or 45 by the main carrier unit 13 and subjected to heat and cooling treatment after exposure processing in order Thereafter, the wafer W is transferred to the developing treatment unit 18 or 20 and subjected to developing treatment. The wafer W subjected to the developing treatment is transferred to the postbaking unit 35 or 36 and heated. The wafer W is then transferred to the cooling unit 33 or 34 and cooled to a predetermined temperature. The wafer W is then transferred to the extension unit 32, and returned therefrom to the cassette C in the cassette station 2 by the wafer carrier 7. A successive photolithography process is completed through the aforesaid steps.

According to the aforesaid embodiment, the protective film 61 is formed on the surface of the resist film 60 by supplying the protective gas, whereby the protective film 61 can protect the wafer W from impurities such as oxygen and water vapor in an atmosphere. Especially, if the impurities adhere to the wafer W when the wafer W is subjected to exposure processing, there is a possibility that the impurities absorb energy of a laser beam or the like used in exposure so that the predetermined circuit pattern can not be precisely exposed onto the resist film 60. The aforesaid formation of the protective film 61, however, enables suitable exposure processing. Further, the protective film 61 formed by the protective gas is excellent in permeability, and permits a beam with a wavelength as short as about 157 nm to pass it. Accordingly, the adhesion of impurities to the resist film 60 formed on the wafer W is prevented while the predetermined circuit pattern can be precisely exposed on the resist film 60, thereby greatly improving the yield of the wafer W. The shorter the wavelength of a laser beam used in the aligner 5 is, the larger an influence exerted by the impurities is. Therefore, its effect is large when a laser beam with a short wavelength is used.

Especially, if the protective gas is a fluorine ($F_2$) series gas, the adhesion of water and the like can be prevented, and the protective film 61 excellent in permeability can be obtained.

Figure 9:
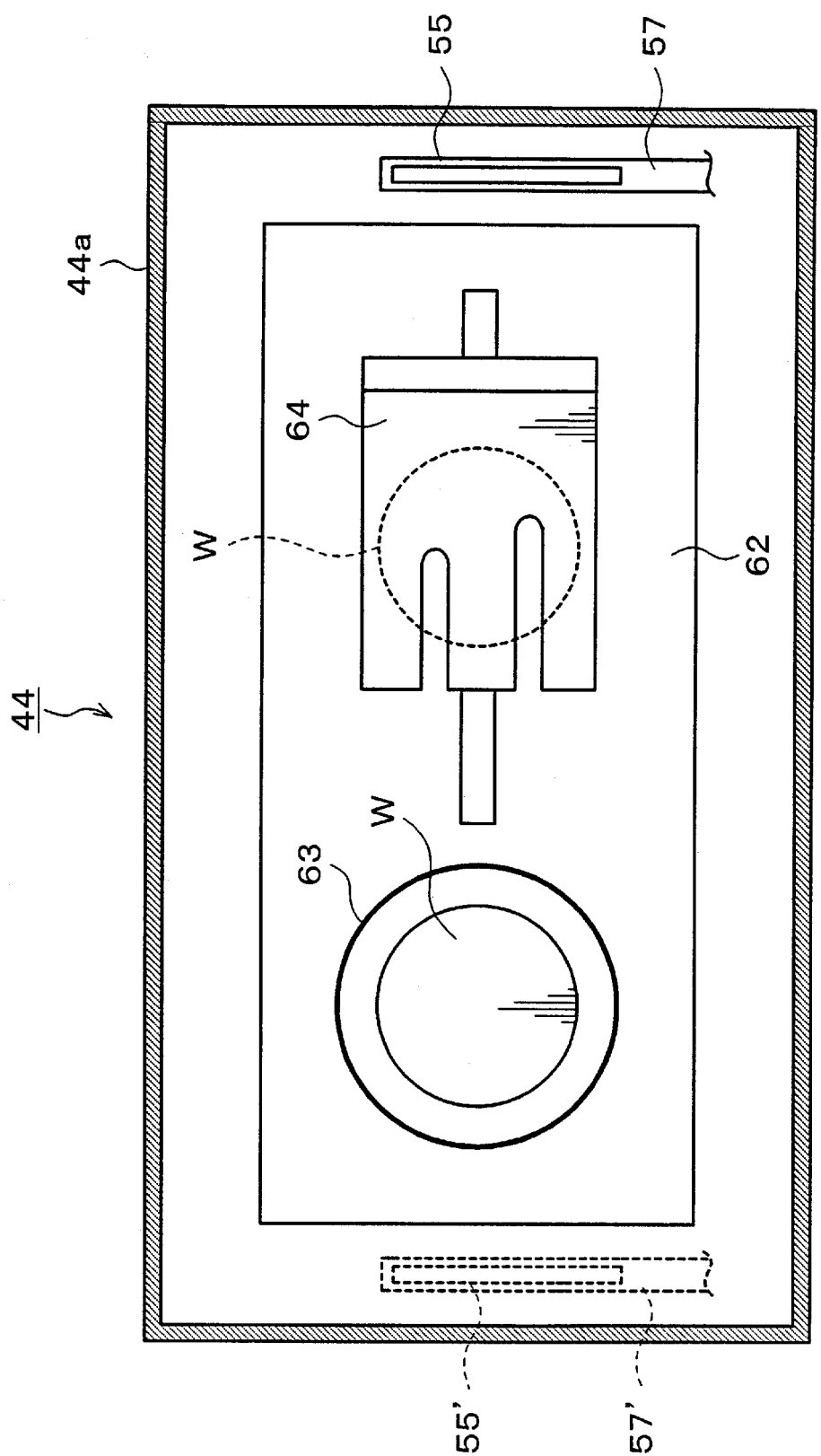
FIG. 9 is a schematic horizontal sectional view showing the heat and cooling treatment unit when a gas nozzle is provided.

Incidentally, although an example of the embodiment of the present invention is explained, the present invention is not limited to this example, and can be modified variously. For example, a time to form the protective film 61 on the :wafer W can be set flexibly according to various situations. Namely, as shown in FIG. 9, the gas nozzle 55 and the arm 57 may be provided in the heat and cooling treatment unit 43. As shown in FIG. 9, the gas nozzle 55 and arm 57 shown by the fill line are disposed on the chill plate 64 side.

Figure 10:
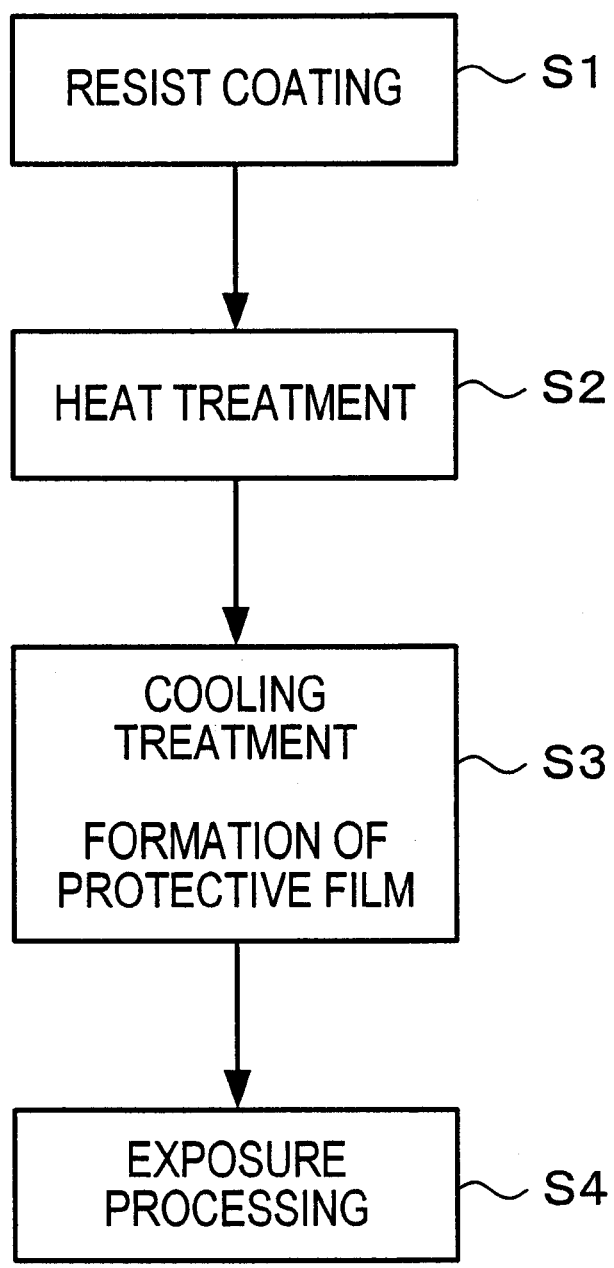
FIG. 10 is a flowchart showing a treatment flow from resist coating to exposure processing when the gas nozzle is provided in the heat and cooling treatment unit.

According to such a structure, as in S4 in FIG. 8 explained above, the gas nozzle 55 is moved to a position above the wafer W after cooling treatment, and the protective film 61 can be formed immediately. Further, as shown in FIG. 10, it is suitable that after heat treatment (S2 in FIG. 10), the gas nozzle 55 is moved and that the protective film 61 is formed on the surface of the resist film 60 while the wafer W is cooled (S3 in FIG. 10).

Figure 11:
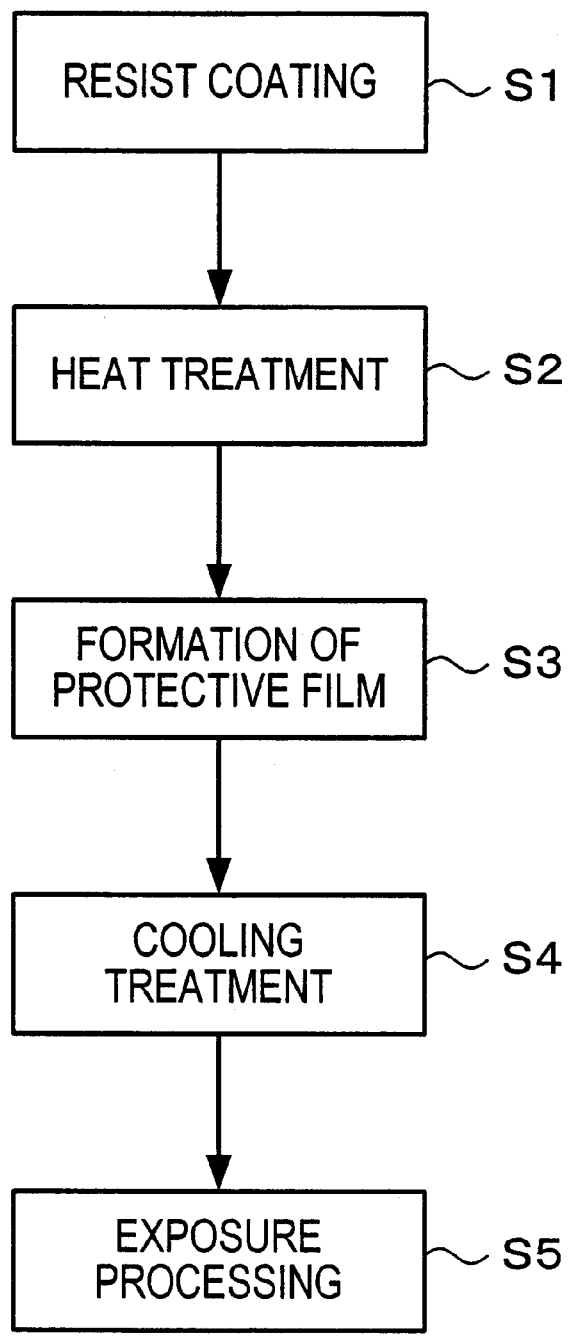
FIG. 11 is a flow chart showing a modification example of the treatment flow from resist coating to exposure processing when the gas nozzle is provided in the heat and cooling treatment unit.

Furthermore, as shown in the two-dot chain lines 55' and 57' in FIG. 9, the gas nozzle 55 and the arm 57 may be also disposed on the hot plate 63 side. In this case, as shown in FIG. 11, it is suitable that after heat treatment (S2 in FIG. 11), the gas nozzle 55 is moved, the protective film 61 is formed on the surface of the resist film 60 (S3 in FIG. 11), and that thereafter cooling treatment (S4 in FIG. 11) and exposure processing (S5 in FIG. 11) are continuously performed.

Figure 12:
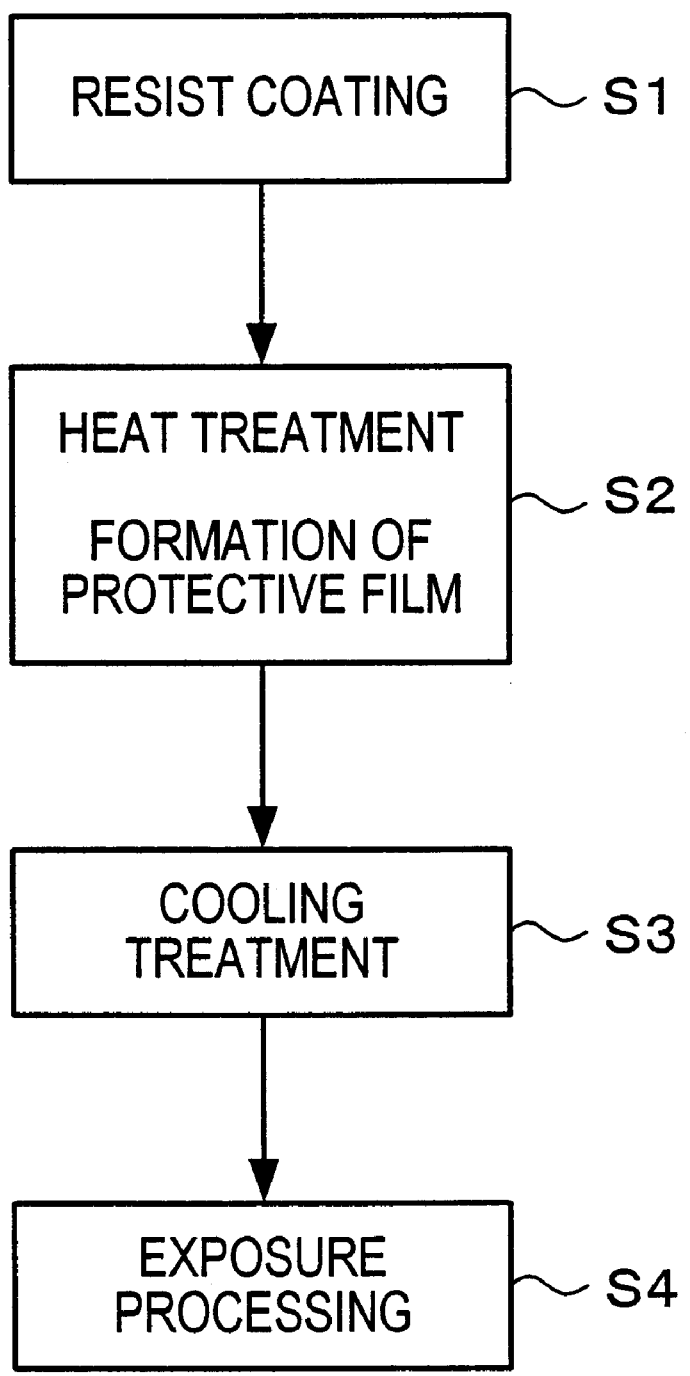
FIG. 12 is a flow chart showing another modification example of the treatment flow from resist coating to exposure processing when the gas nozzle is provided in the heat and cooling treatment unit.

Moreover, as shown in FIG. 12, it is suitable that the gas nozzle 55 is moved and that the protective film 61 is formed on the surface of the resist film 60 during heat treatment (S2 in FIG. 12). As a result, the protective gas is supplied from a relatively early stage, which makes it possible to form the protective film 60 on the wafer W before the adhesion of impurities such as oxygen and ozone. Basically, it is desirable to form the protective film 61 on the surface of the resist film 60 after the solvent in the resist solution is fully vaporized by heating.

Figure 13:
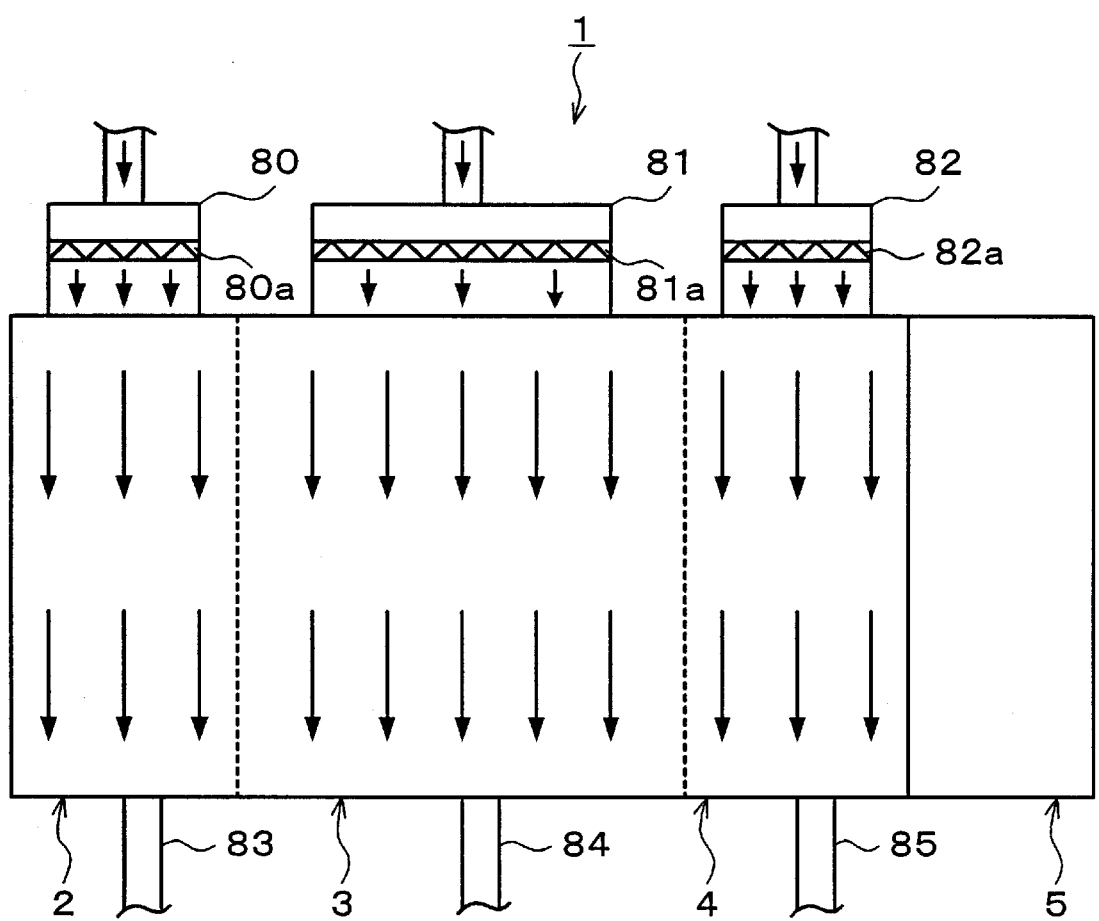
FIG. 13 is an explanatory view when a gas supply unit is provided on the top of each area of the coating and developing treatment system 1 in FIG. 1 and an exhaust pipe is provided at the bottom of each area thereof.

In order to prevent the adhesion of impurities more certainly, for example, as shown in FIG. 13, gas supply units 80, 81, and 82 for supplying an inert gas such as $N_2$ gas may be separately provided on the top of respective areas of the cassette station 2, the processing station 3, and the interface section 4, and exhaust pipes 83, 84, and 85 may be provided at the bottom of the respective areas.

The gas supply units 80, 81, and 82 have ULPA filters $80_a$, $81_a$, $82_a$ for removing particulates in the inert gas respectively. According to such a structure, impurities such as oxygen, ozone, and water vapor are purged from within the respective areas, and thus a clean atmosphere can be maintained within each area.

Incidentally, although the embodiment explained above relates to the coating and developing treatment system for the wafer W in photolithography of the semiconductor wafer device fabrication process, the present invention can be applied to a coating and developing treatment system for substrates other than a semiconductor wafer, for example, an LCD substrate.

What is claimed is:

1. A method for performing coating and developing treatment for a substrate, comprising the steps of:

supplying a coating solution to the substrate to form a coating film on the substrate;

performing heat treatment for the substrate on which the coating film is formed;

cooling the substrate after the heat treatment;

performing exposure processing for the coating film formed on the substrate; and developing the substrate after the exposure processing, said method, further comprising the step of:

supplying a treatment gas to form a treatment film on a surface of the coating film after said step of forming the coating film and before said step of performing the exposure processing for the substrate.

2. A method as set forth in claim 1, wherein said step of supplying the treatment gas to form the treatment film on the surface of the coating film is performed after said step of cooling the substrate after the heat treatment.

3. A method as set forth in claim 1, wherein said step of supplying the treatment gas to form the treatment film on the surface of the coating film is performed during said step of cooling the substrate after the heat treatment.

4. A method as set forth in claim 1, wherein said step of supplying the treatment gas to form the treatment film on the surface of the coating film is performed after said step of performing the heat treatment.

5. A method as set forth in claim 1, wherein said step of supplying the treatment gas to form the treatment film on the surface of the coating film is performed during said step of performing the heat treatment.

6. A method as set forth in claim 1, wherein the treatment gas is a gas which reduces surface energy of the coating film.

7. A method as set forth in claim 6, wherein the gas is a gas which makes the surface of the coating film hydrophobic.

8. A method as set forth in claim 6, wherein the gas is a fluorine series gas.

\* \* \* \* \*